United States Patent [19]

Hahn, IV et al.

[11] Patent Number: 6,024,589

[45] Date of Patent: *Feb. 15, 2000

[54] POWER BUS BAR FOR PROVIDING A LOW IMPEDANCE CONNECTION BETWEEN A FIRST AND SECOND PRINTED CIRCUIT BOARD

[75] Inventors: John W. Hahn, IV, Citrus Heights; James K. Koch, Rocklin, both of Calif.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/856,500

[22] Filed: May 14, 1997

[51] Int. Cl.$^7$ ........................................................ H01R 4/60
[52] U.S. Cl. ...................... 439/212; 174/71 B; 174/72 B; 361/775
[58] Field of Search .......................... 437/212; 174/70 B, 174/71 B, 72 B, 88 B, 99 B, 268; 361/775, 749

[56] References Cited

U.S. PATENT DOCUMENTS

| | | | |
|---|---|---|---|
| 4,008,365 | 2/1977 | Carlson | 174/88 B |
| 4,758,927 | 7/1988 | Berg | 361/401 |
| 4,867,696 | 9/1989 | Delmer, Jr. et al. | 174/72 B |
| 4,981,449 | 1/1991 | Buchter | 439/668 |
| 5,184,284 | 2/1993 | Ashelin et al. | 361/400 |
| 5,290,971 | 3/1994 | Hamaguchi et al. | 174/267 |
| 5,313,367 | 5/1994 | Ishiyama | 361/772 |
| 5,317,479 | 5/1994 | Pai et al. | 361/773 |
| 5,430,614 | 7/1995 | Difrancesco | 361/785 |

*Primary Examiner*—Steven L. Stephen
*Assistant Examiner*—T C Patel
*Attorney, Agent, or Firm*—Denise A. Lee

[57] ABSTRACT

The present invention provides a reliable high current connector for connecting the ground and power planes of a first PCB to the ground and power planes of a second PCB. The power bus bar is comprised of a first conductive structure having a first and second surface, a second conductive structure having a first and second, and an inner insulative structure positioned between the first surface of the first conductive structure and the first surface of the second conductive structure. A fastening means, inserted through openings in the conductive structures, provides a secure, low resistance electrical connection from the first or second conductive structure of the bus bar to the electrical traces of the PCB. The high dielectric constant of the insulator provides distributed capacitance between the first conductive structure and the second conductive structure, lowering the AC impedance. The bus bar design mounts both above and below each PCB and increases mechanical strength and spatial efficiency compared to previous bus bar designs.

9 Claims, 6 Drawing Sheets

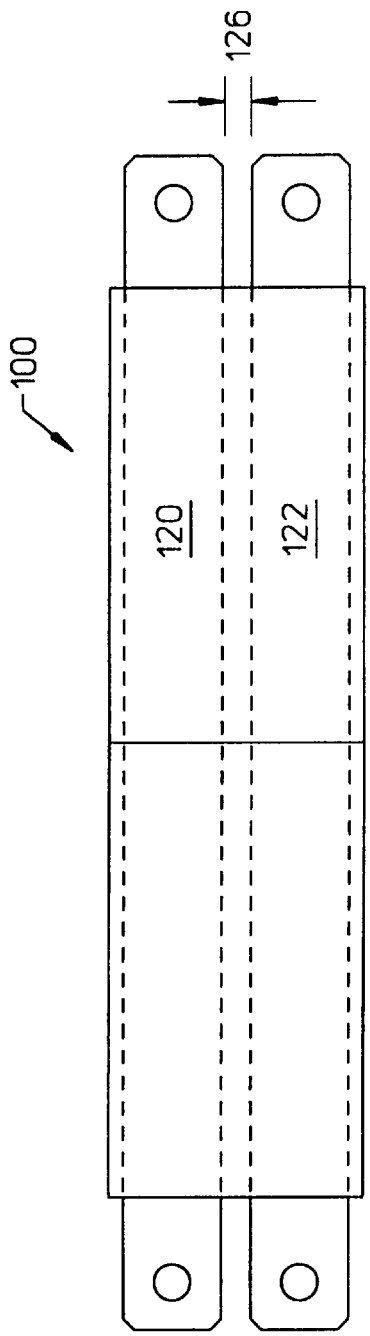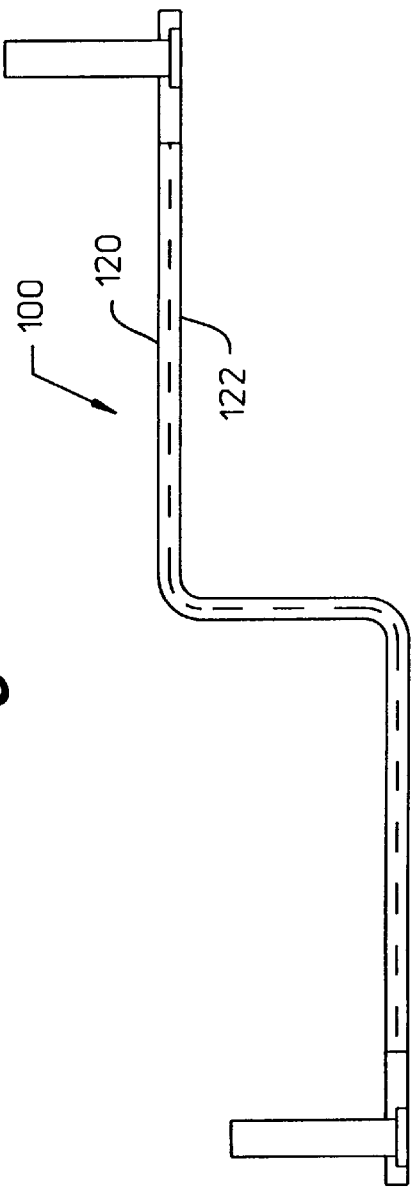
PRIOR ART
Figure 1A
PRIOR ART
Figure 1B

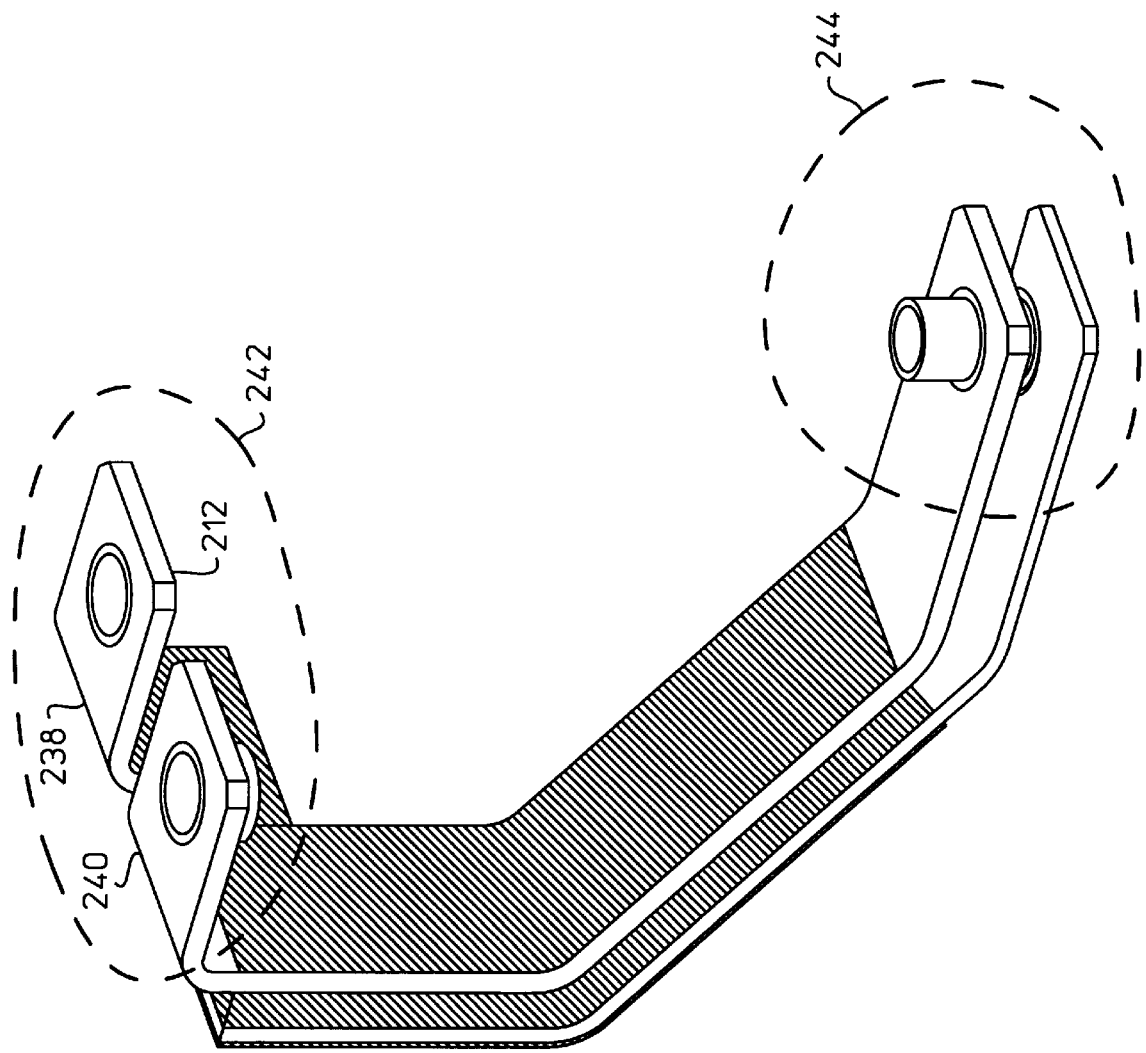

POWER BUS BAR FOR PROVIDING A LOW IMPEDANCE CONNECTION BETWEEN A FIRST AND SECOND PRINTED CIRCUIT BOARD

REFERENCE TO RELATED APPLICATION

Reference is made to the following co-pending and commonly assigned U.S. patent application entitled: SPACE EFFICIENT MOUNTING PLATFORM FOR VOLTAGE REGULATOR, Ser. No. 08/856,312, May 14, 1997.

BACKGROUND OF THE INVENTION

Usually power is routed from one printed circuit board assembly (PCA) to another printed circuit board assembly using a direct printed circuit board (PCB) to printed circuit board connection using board mount connectors. Although board mount connectors provide easy assembly, they typically require significant board space. Not all geometry constraints allow for a direct board to board connection. In some cases, the power requirements and geometric constraints of the PCA to PCA connector can be made using a cable/connector or bus bar solution.

Existing solutions which utilize a cable/connector solution for connecting a first PCA to a second PCA include: plastic molded connectors attached to cables which plug into mating connectors on either PCA and uninsulated metal power pins that can be placed on each PCA and then connected by receptacles at the ends of the wire. Electrical connection between the cable mechanism and the PCA is typically made using a mating connector which is soldered to the PCA. A problem with the aforementioned cable/connector solutions is that they have a relatively high electrical impedance. The cable/connector impedance includes the impedance at the interface between the wire and the first connector, the impedance of the interface between the wire and the second connector, and the impedance inherent in the wire itself. A further problem with prior cable/connector solutions is that they can be difficult to assemble for high current applications since high current applications typically require a large wire thickness. The large wire thickness makes the cable/connector solutions difficult to manage in a limited space.

A second solution for electrically connecting a first PCB to a second PCB is a power bus bar. FIG. 1A shows a top view of a conventional bus bar 100 used to electrically connect a first printed circuit board (not shown) to a second printed circuit board (not shown). FIG. 1B shows a side cross-sectional view of a conventional bus bar of the power bus bar shown in FIG. 1A. The bus bar 100 shown in FIGS. 1A and 1B is comprised of a first electrically conductive structure 120 and a second electrically conductive structure 122. The first electrically conductive structure 120 is connected to the power plane of both the first and second printed circuit boards. The second electrically conductive structure 122 is connected to the ground planes of both the first and second printed circuit boards.

Referring to FIG. 1A, the first and second electrically conductive structures 120, 122 are physically located on the same plane and are placed side by side so that the sidewalls of the first and second electrically conductive structures 120, 122 and are separated by a predetermined distance 126. A first insulative layer is placed on the top surfaces of the first and second electrically conductive structures 120, 122. A second insulative layer is placed beneath the first and second electrically conductive structures. The second insulative layer typically has adhesive properties to solidify the positioning of the first and second conductive structures 120, 122 thus preventing movement. Electrical contact between the conductive structures and the PCBs is made by securing each conductive structure to an electrical contact of the PCB. Compared to the cable/connector solution, electrical resistance is decreased. However, because the first and second structures are placed side by side in the same plane, the inductance of the bus bar structure is relatively high. Further, it is desirable to further minimize the geometric requirements of the bus bar connector.

A spatially efficient, reliable high current connector for connecting the ground and power planes of a first printed circuit board to the ground and power planes of a second printed circuit board is needed.

SUMMARY OF THE INVENTION

The present invention provides a reliable, high current connector to a printed circuit board or printed circuit board assembly. In the preferred embodiment of the present invention, the bus bar is used for electrically coupling the ground and power planes of a first printed circuit board to the ground and power planes of a second printed circuit board. The bus bar is spatially efficient and minimizes the amount of space needed to make an electrical connection between the first and second printed circuit boards. Further, the present invention provides a low impedance, reducing voltage drops and improving the transient response of the system.

The power bus bar is comprised of a first conductive structure having a first and second surface, a second conductive structure having a first and second surface, and an insulative structure positioned between the first surface of the first conductive structure and the first surface of the second conductive structure. The first end of the first conductive structure and a first end of the second conductive structure form a first contacting structure. A similar contacting structure is formed by the second end of the first conductive structure and the second end of the second conductive structure. The first surface of the first contacting structure electrically couples to a first electrical contact on a first plane (typically the power plane of a first printed circuit board) and a second surface of the contacting structure electrically couples to a first electrical contact on a second plane (typically the ground plane of the first printed circuit board). The first surface of the first contacting structure is typically at a different height and is generally parallel to the second surface of the first contacting structure.

In the preferred embodiment, both the first and second conductive structures include a first opening at the first end of both the first and second conductive structures and a second opening at the second end of both the first and second conductive structures. A first fastening means, preferably a screw, is inserted through both the first opening of the first conductive structure and the first opening of the second conductive structure. Similarly, a second fastening means is inserted through the second opening of the first conductive structure and the second opening of the second conductive structure. A screw provides a high pressure contact which provides a secure, low resistance electrical connection from the first or second conductive structure of the bus bar to the electrical traces of the PCB. Further, resistance of the bus bar according to the present invention has a reduced resistance at the board interface because of (1) the high pressure contact created by the screw fastener and (2) the ample contact area.

The first conductive structure and second conductive structure form a low impedance transmission line at high frequencies. The high dielectric constant of the insulative structure provides distributed capacitance between the first conductive structure and the second conductive, lowering the AC impedance and thereby improving the transient response. Further, compared to the bus bar described in FIG. 1, the present invention makes a large current loop which increases radiated emissions. The form factor of the present invention reduces the magnetic loop area of the power connection which reduces radiated emissions and susceptibility. Reducing the radiated emissions of the power connection improves the transient response of the power distribution system.

Compared to the prior bus bar design which electrically couples to a PC board at multiple electrical contact points on a single plane, the bus bar design according to the present invention mounts both above and below each printed circuit board. The prior design of having two connectors mount on a single plane is problematic since it increases the surface area needed to make an electrical connection to the PCB. Having a connector electrically couple both above and below (making electrical contact on a both a first plane and on a second plane) of the printed circuit board reduces the assembly time and manufacturing costs by reducing the number of the fasteners required. Further, the connector mount configuration according to the present invention strengthens the thickness of the bus bar by increasing its thickness by 50%, thus providing for a more stable mechanical design. Because of the increased thickness of the bus bar, the width of the bus bar may be decreased further increasing the spatial efficiency of the design.

A further understanding of the nature and advantages of the invention described herein may be realized by reference to the remaining portions of the specification and drawings.

BRIEF DESCRIPTION OF THE DRAWINGS

FIG. 1A shows a top view of a prior art power bus bar used to electrically connect a first PCB to a second PCB.

FIG. 1B shows a side cross-sectional view of a conventional bus bar of the power bus bar shown in FIG. 1A.

FIG. 4 shows an isometric view of an alternative contacting structure for the power bus bar according to the present invention.

DETAILED DESCRIPTION OF THE PREFERRED EMBODIMENTS

Figure 2A:
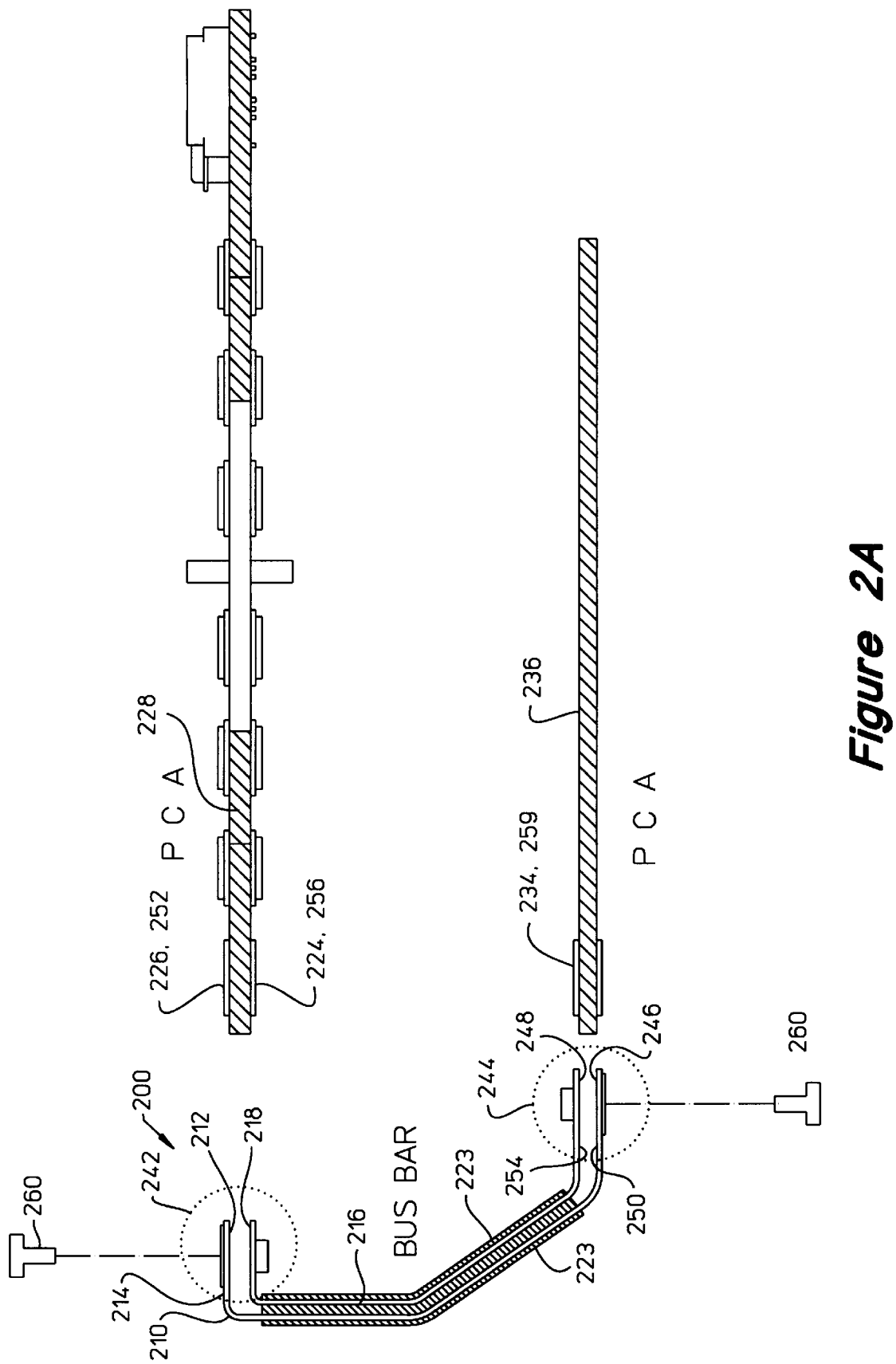
FIG. 2A shows a side cross-sectional view of the bus bar according to the present invention before insertion of a fastening means and before insertion of the printed circuit boards.

FIG. 2A shows a cross-sectional view of the power bus bar 200 according to the present invention before insertion of a fastening means and before insertion of the printed circuit boards. The power bus bar 200 is comprised of a first conductive structure 210 having a first surface 212 and a second surface 214, a second conductive structure 216 having a first surface 218 and second surface 220, and an inner insulative structure 222 positioned between the first surface 212 of the first conductive structure 210 and the first surface 218 of the second conductive structure 216.

In the preferred embodiment, the first and second conductive structures 210, 216 are electrically conductive elongate structures having a length greater than its width or thickness. Typically, the length of the bus bar varies widely and is dependent on the distance between the two printed circuit boards. The width of the bus bar is typically in the range of 5 to 40 mm and the thickness of the bus bar is typically in the range of 0.2 to 2.0 mm. The required length, width, and thickness of the bus bar is dependent on the amount of current that is required to be carried by the bus bar.

The first and second conductive structures 210, 216 of the bus bar 200 are preferably constructed of ½ hard copper. Since the first and second conductive structures 210, 216 are made of solid, formed ½ copper, the bus bar structure holds its shape well, making assembly easy. The bus bar 200 is constructed by laminating two pieces of blanked and formed copper (the first and second conductive structures) together using insulation (the inner insulative structure). Although not required, in an alternative embodiment an insulator 223 is adhered to portions of the second surfaces 214, 220 of the first and second conductive structures 210, 216.

The bus bar 200 is typically used to connect the ground plane 224 and power plane 226 of a first printed circuit board 228 to the ground and power planes 234, 232 of a second printed circuit board 236. After PC board insertion, the first conductive structure 210, the outer bus bar, is electrically coupled to the power plane 226 of the first PCB 228 and the power plane PCB and brings power in. After PC board insertion, the second conductive structure 216, the inner bus bar, is typically electrically coupled to the ground plane 224 of the first PCB 228 and the ground plane 234 of the second PCB 236 and is the electrical return.

The first and second conductive structures 210, 216 form a low impedance transmission line at high frequencies. Thus, in the preferred embodiment, the inner insulative structure 222 has a high dielectric constant, preferably in the range of 1 to 100. The configuration of the present invention, two conductive structures 210, 216 separated by an inner insulative structure, provides distributed capacitance between the first and second conductive structures, lowering the AC impedance of the system. Typically an adhesive is used to adhere the inner insulative structure 222 to the first surface of the first conductive structure and the first surface of the second conductive structure.

Further, the connector mount configuration according to the present invention strengthens the part compared to the power bus bar 100 shown in FIG. 1, by increasing the bus bar thickness by 50% or more by adding a second conductive structure 216 and an inner insulative structure 222 to the bus bar. Increasing the thickness of the bus bar provides a more stable mechanical design. Because of the increased strength, the width of the bus bar may be decreased, further increasing the spatial efficiency of the design.

Figure 2B:
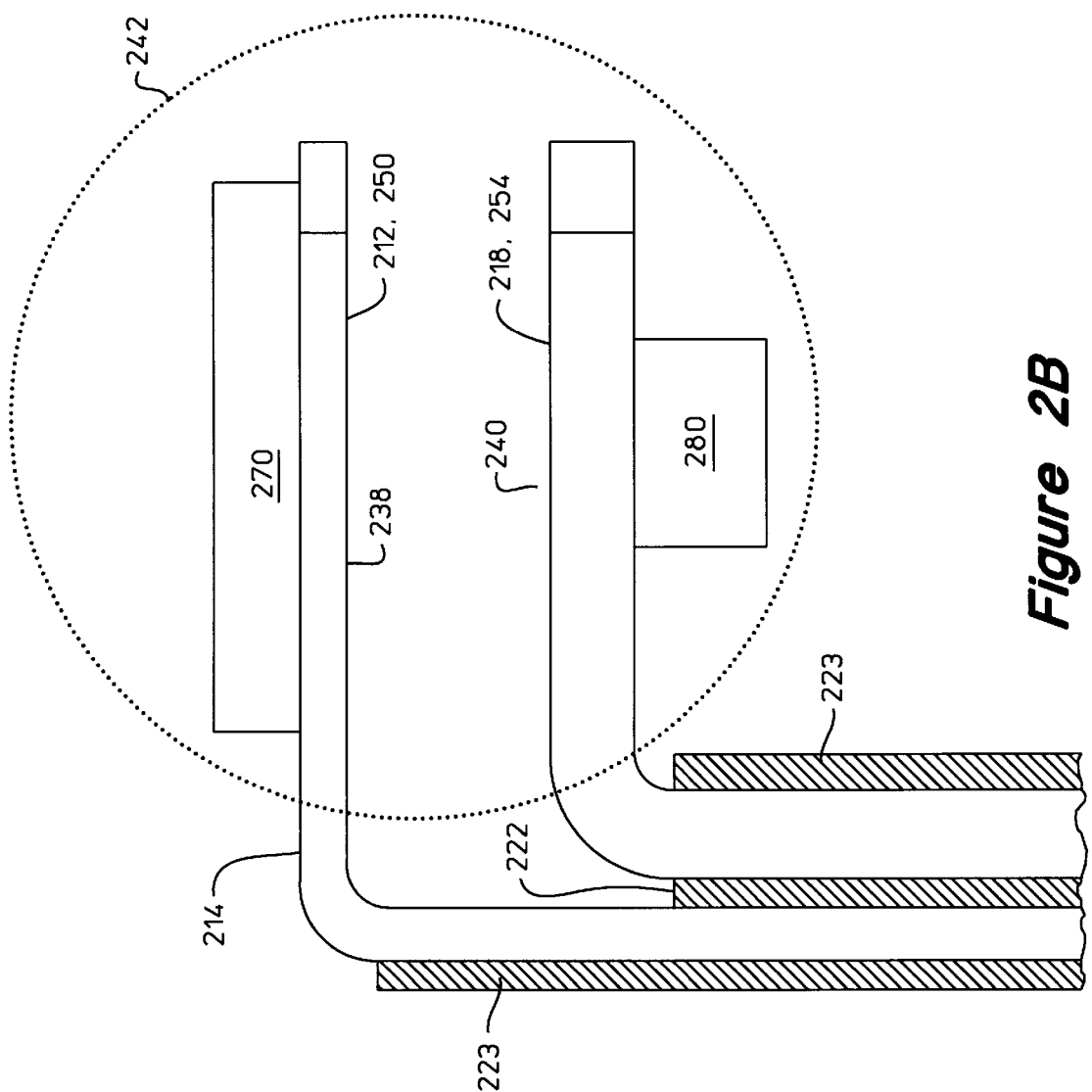
FIG. 2B shows an expanded view of the first contacting structure shown in FIG. 2A.

Referring to FIG. 2B shows an expanded view of the first contacting structure 242 shown in FIG. 2A. The first end 238 of the first conductive structure 210 and a first end 240 of the second conductive structure 216 form a first contacting structure 242. A similar contacting structure 244 is formed by the second end 246 of the first conductive structure 210 and the second end 248 of the second conductive structure 216. The first surface 250 of the first contacting structure 242 electrically couples to a first electrical contact 252 on a first plane (typically the power plane of a first printed circuit board) and a second surface 254 of the first contacting structure 242 electrically couples to a first electrical contact 256 on a second plane (typically the ground plane of the first printed circuit board). The first surface 250 of the first contacting structure 242 is typically at a different height and is generally parallel to the second surface 254 of the first contacting structure 242.

The second end 246 of the first conductive structure 210 and a second end 248 of the second conductive structure 216 form a second contacting structure 244. The first surface 250 of the second contacting structure 244 electrically couples to a first electrical contact 258 on a third plane (typically the power plane of a second printed circuit board). A second surface 254 of the contacting structure electrically coupling to a first electrical contact 259 on a fourth plane (typically the ground plane of a second printed circuit board). Typically, the first surface 250 of the second contacting structure 244 is at a different height and is generally parallel to the second surface 254 of the second contacting structure 244.

Figure 2C:
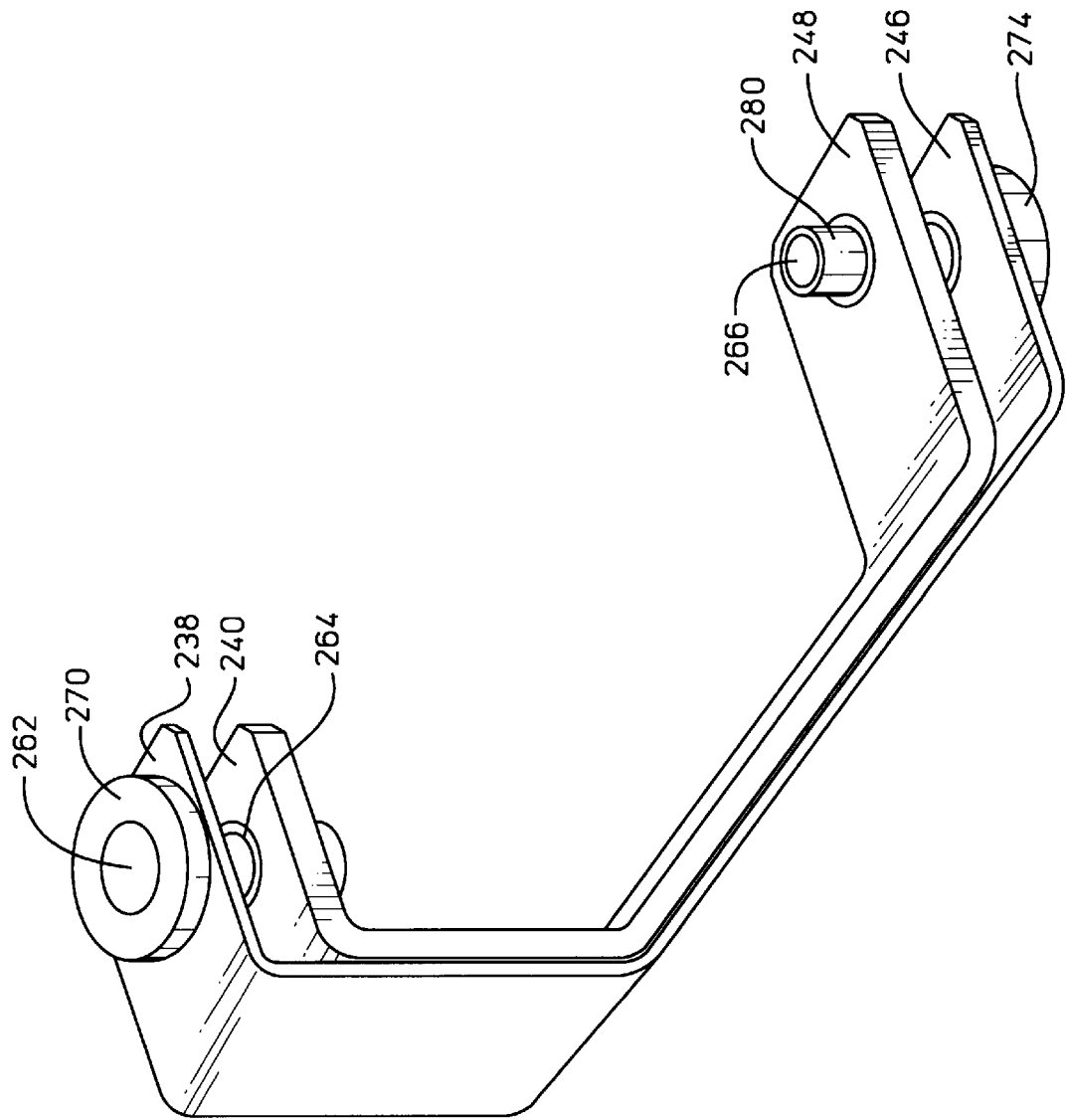
FIG. 2C shows an isometric view of the bus bar according to the present invention.

In the embodiment shown in FIGS. 2A–2C, the power bus bar 200 further includes a fastening means 260 at the end of the contacting structures 242, 244. The fastening means 260 is used to apply pressure to the first contacting structure 242, the pressure applied to the fastening means 260 forces the first surface of the first contacting structure towards the second surface of the first contacting structure. In the embodiment shown in FIG. 2A, the fastening means includes a screw.

Referring to FIG. 2C shows an isometric view of the bus bar 200 according to the present invention. A first opening 262 is located at a first end 238 of the first conductive structure 210 and a second opening 268 is located at a second end 246 of the first conductive structure 210. Similarly, a first opening 264 is located at a first end 240 of the second conductive structure 216 and a second opening 266 is located at a second end 248 of the second conductive structure 216. Preferably the central axis of the first opening 262 of the first conductive structure 210 is aligned with the central axis of the first opening 264 of the second conductive structure 216 and the central axis of the second opening 268 of the first conductive structure 210 is aligned with the central axis of the second opening 266 of the second conductive structure 216.

In the embodiment shown in FIGS. 2A–2C, a first electrically insulative washer 270, typically a shoulder washer, is positioned over the second surface 214 of the first conductive structure 210. The opening of the first electrically insulative washer 270 is positioned so that at least a portion of its opening is positioned over the first opening 262 of the first conductive structure 210. Preferably the central axis of the first electrically insulative washer 270 is aligned with the central axis of the first opening 262 of the first conductive structure 210. Similarly, a second insulative washer 274 having an opening is positioned over the second surface of the first conductive structure 210, the second insulative washer 274 is positioned so that at least a portion of its opening is positioned over the first opening 268 of the first conductive structure 210. Preferably the central axis of the second electrically insulative washer 274 is aligned with the central axis of the second opening 268 of the first conductive structure 210. Typically an adhesive is used to adhere the insulative washers 270, 274 to the first and second conductive structure 210.

Although the embodiment shown in FIG. 2 shows an insulative washer, any insulative structure which prevents the screw (typically a conductor) from electrically contacting both the first and second conductive structures could be used. For example an insulating sleeve could be used in combination with the screw or alternatively a nylon screw could be used. What is important is that the metal fastening means be electrically insulated from at least one of the electrical contacting surfaces.

In the preferred embodiment of the bus bar 200, a nut or threaded fastener 280 permanently pressed into the second surface of both the first end and the second end of the second conductive structure 216. Permanently pressing the threaded fastener 280 to the second conductive structure 216 both reduces the electrical resistance of the bus bar and reduces fabrication costs and time, since the assembler is no longer required to put on a threaded fastener. However, permanently pressing the threaded fastener is optional. In an alternative embodiment, a nut could be used on the other side of the screw to secure the screw. Further, it is not required that the fastening means on both ends of the bus bar be identical, for example, in one embodiment a screw could be inserted into the openings at the first end of the first and second conductive structures and a different fastening means, such as a rivet, could be used to fasten the second end of the first and second conductive structures.

The bus bar 200 is typically used to connect the ground and power planes of a first printed circuit board to the ground and power planes of a second printed circuit board. FIG. 2A shows a side cross-sectional view of the bus bar according to the present invention before insertion of a fastening means 260 and before insertion of the printed circuit boards 228, 236. Electrical connection from the bus bar 200 to each of the PCBs 228, 236 is made by sliding each PCB 228, 236 into the space between the first and second surfaces of the contacting structures and then fastening the bus bar 200 to the PCB 228, 236. For the type of fastening means 260 shown in FIG. 2, a screw is positioned through openings 262, 264, 266, 268 of the bus bar and openings in the first and second printed circuit board 228, 236.

Figure 3:
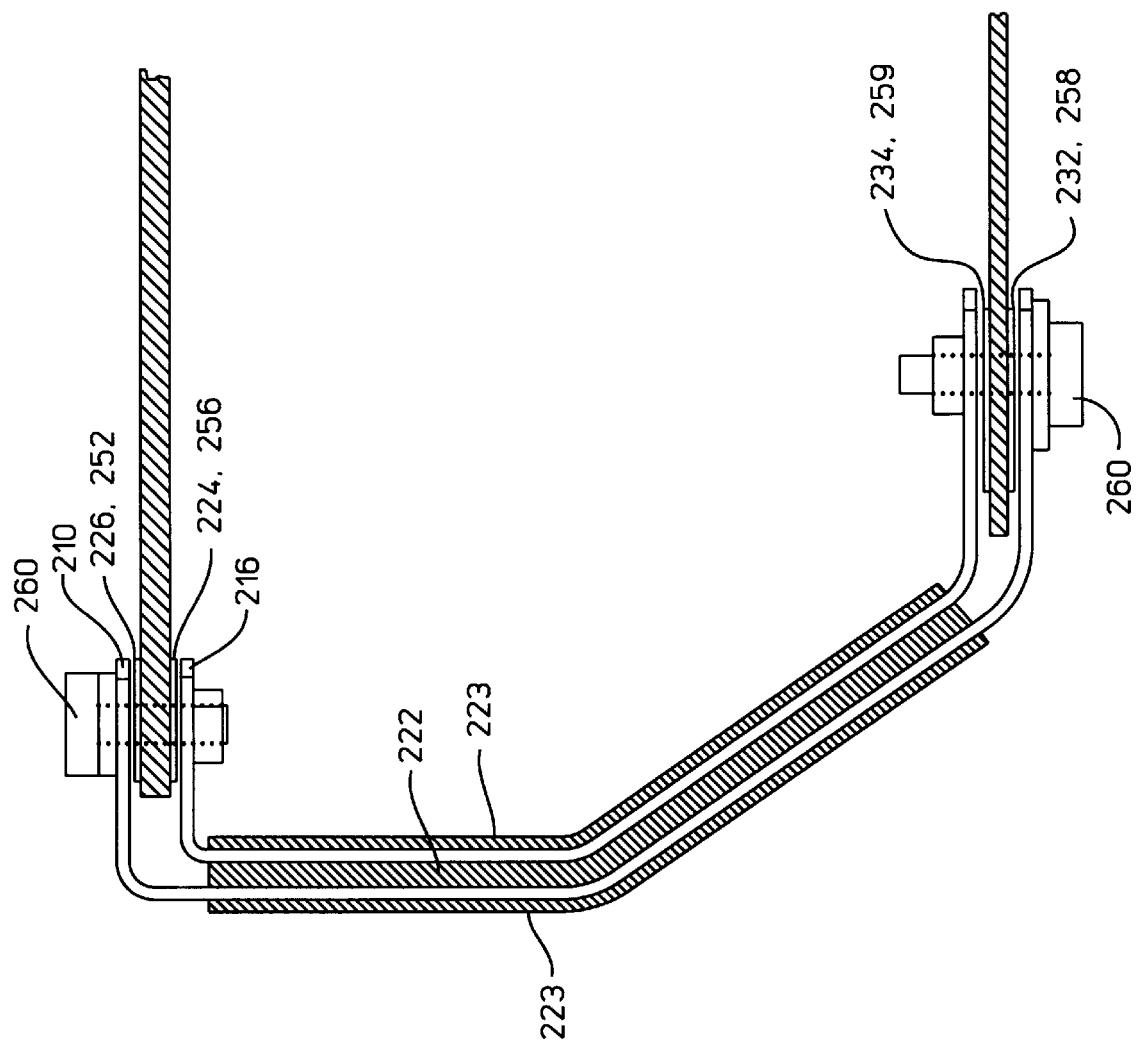
FIG. 3 shows a side cross-sectional view of the bus bar according to the present invention after insertion of the printed circuit boards and after insertion of the fastening means.

In embodiment shown in FIG. 3, the printed circuit boards are fastened to the bus bar assembly using a screw 260. FIG. 3 shows a side cross-sectional view of the bus bar 200 according to the present invention after insertion of the printed circuit boards 228, 236 and after insertion of the fastening means 260. The power bus bar 200 shown in FIG. 3 is used for electrically coupling a first electrical contact 252 on a first plane of the first printed circuit board 228 to a first electrical contact 258 on a first plane of a second printed circuit board 236 and for electrically coupling a first electrical contact 256 on a second plane of a first printed circuit board 228 to a first electrical contact 259 on a second plane of a second printed circuit board 236.

A fastening means 260, preferably a screw, is inserted through both the first opening of the first conductive structure 210 and the first opening of the second conductive structure 216. Similarly, a fastening means is inserted through the second opening of the first conductive structure 210 and the second opening of the second conductive structure 216. After the screws 268 are inserted through the openings of the conductive structure the pressure is adjusted. In general, contact resistance can be reduced by increasing the pressure created by the fastening means.

A screw 260 provides a high pressure contact which provides a secure, low resistance electrical connection to the first or second conductive structure 210, 216 of the bus bar to the electrical contacts of the PCB. Further, resistance of the bus bar according to the present invention has a reduced resistance at the board interface because of the high pressure contact created by the screw fastener 260.

Although in the preferred embodiment screws are used, other fastening means may be used. For example, a rivet or some sort of clamping mechanism may be used. The important criteria for the fastening means is that it provide sufficient pressure to make good electrical contact to the first structure and the second structure.

Further, if the space between the first and second surfaces of the contacting structure is precisely made to be approximately the width of the PCB or slightly less than the width of the PCB, the contacting structure may provide sufficient mechanical pressure to provide a good electrical contact. Applicant believes a problem associated with this alternative bus bar configuration is that it requires a more precise fit, potentially increasing the manufacturing costs of the bus bar. Further, the alternative bus bar which does not use a fastening means to secure the electrical connection, is less mechanically stable and more susceptible to a loss of electrical connection since it provides a friction fit as opposed to a high pressure contact, however a spring contact would be needed. In this alternative embodiment of bus bar, insulative washer structures, openings in conductive structures and fasteners are typically eliminated since no longer necessary to provide a high pressure contact. Although increase in cost for more precise fit, manufacturing and assembly cost is decreased due to elimination of insulative washer structures, openings in conductive structures and screws.

Referring to FIG. 4 shows an alternative contacting structure for the power bus bar shown in FIGS. 2, and 3A–3C. In the alternative embodiment, the two contacting structures are different. In the embodiment shown in FIG. 4, the first contacting structure 242 is modified while the second contacting structure remains the same. Although the first contacting structure is modified in the embodiment shown in FIG. 4, in an alternative embodiment the second contacting structure is modified and the first contacting structure is unchanged.

In the alternative embodiment shown in FIG. 4, the first contacting structure is modified so that electrical connection to a first and second voltage plane (typically ground and power plane) are in the same plane. In the embodiment shown in FIG. 4, the first end of the first conductive structure and a first end of the second conductive structure form a first contacting structure. However, in contrast to the first contacting structure 242 shown in FIGS. 2A–2C and FIG. 3, the first surface of the first contacting structure for electrically coupling to a first electrical contact on a first plane, and a second surface of the contacting structure for electrically coupling to a second electrical contact on the first plane.

Preferably the modified contacting structure connects the power plane and ground planes of a first printed circuit board to the ground and power terminals of a power supply. In this alternative embodiment, the power bus bar electrically couples a first electrical contact on a first plane of a first printed circuit board to a first terminal and a first electrical contact on a second plane of a first printed circuit board to a second terminal. The power bus bar is comprised of a first conductive structure having a first surface and a second surface; a second conductive structure having a first surface and a second surface, and an inner insulative structure positioned between the first surface of the first conductive structure and the second conductive structure.

It is understood that the above description is intended to be illustrative and not restrictive. For example, the bus bar has two ends and statements made with respect to a first end of the bus bar are typically applicable to the second end of the bus bar and statements made with respect to the first conductive structure are typically applicable to the second conductive structure. Further, although the current description is made with respect to connection between a first and second printed circuit boards, the present invention may be used to connect multiple printed circuit boards or printed circuit board assemblies. Further, the printed circuit board or printed circuit board assembly may be any inner insulative structure with conductive traces. The scope of the invention should therefore be determined not with reference to the above description, but instead should be determined with reference to the appended claims, along with the full scope of equivalents to which such claims are entitled.

What is claimed is:

1. A power interconnection system comprising:

a first conductive structure having a first surface and a second surface;

a second conductive structure having a first surface and a second surface;

an insulative structure positioned between the first surface of the first conductive structure and the first surface of a second conductive structure for electrically isolating the first and second conductive structures;

a first printed circuit board; and a second printed circuit board;

wherein a first end of the first conductive structure and a first end of the second conductive structure form a first contacting structure, a first surface of the first contacting structure being electrically coupled to a first electrical contact formed on a first surface of the first printed circuit board, wherein the first electrical contact formed on the first surface of the first printed circuit board is formed on a subset of the first surface of the first printed circuit board, a second surface of the first contacting structure being electrically coupled to a first electrical contact formed on a second surface of the first printed circuit board, wherein the first electrical contact formed on the second surface of the first printed circuit board is formed on a subset of the second surface of the first printed circuit board, wherein the first surface of the first contacting structure is at a different height and is generally parallel to the second surface of the first contacting structure, wherein the separation between the first surface of the first contacting structure and the second surface of the first contacting structure is approximately equal to the width of the first printed circuit board;

wherein a second end of the first conductive structure and a second end of the second conductive structure form a second contacting structure, a first surface of the second contacting structure being electrically coupled to a first electrical contact formed on a first surface of the second printed circuit board, wherein the first electrical contact formed on the first surface of the second printed circuit board is formed on a subset of the first surface of the second printed circuit board, a second surface of the contacting structure being electrically coupled to a first electrical contact on a second surface of the second printed circuit board, wherein the first electrical contact formed on the second surface of the second printed circuit board is formed on a subset of the second surface of the second printed circuit board, wherein the first surface of the second contacting structure is at a different height and is generally parallel to the second surface of the second contacting structure, wherein the separation between the first surface of the second contacting structure and the second surface of the second contacting structure is approximately equal to the width of the second printed circuit board, and further wherein the first surface of the first contacting structure is at a different height than the first surface of the second contacting structure.

2. The power interconnection system recited in claim 1 further including a fastening means for applying pressure to the first contacting structure, the pressure applied to the fastening means forcing the first surface of the first contacting structure towards the second surface of the first contacting structure.

3. The power interconnection system recited in claim 1 further including a first insulative structure positioned on the second surface of the first conductive structure.

4. The power interconnection system recited in claim 3 wherein a first inner insulative structure is a first insulative washer structure.

5. The power interconnection system recited in claim 4 further including a first opening in the first end of the first conductive structure, and a first opening in the first end of the second conductive structure and an opening in the first insulative washer structure.

6. The power interconnection system recited in claim 5 wherein the fastening means is a screw, the screw being inserted through the first opening in the first end of the first conductive structure, and the a first opening in the first end of the second conductive structure and the opening in the first insulative washer structure.

7. The power interconnection system recited in claim 6 further including a threaded fastener welded to the second surface of the second conductive structure at the first end of the second conductive structure.

8. The power interconnection system recited in claim 1, wherein the inner insulative structure has a dielectric constant in the range of 1 to 100.

9. A power interconnection system comprising:

a first conductive structure having a first surface and a second surface;

a second conductive structure having a first surface and a second surface;

an insulative structure positioned between the first surface of the first conductive structure and the first surface of a second conductive structure for electrically isolating the first and second conductive structures;

a first printed circuit board; and a second printed circuit board;

wherein a first end of the first conductive structure and a first end of the second conductive structure form a first contacting structure a first surface of the first contacting structure being electrically coupled to a first electrical contact formed on a first surface of the first printed circuit board, wherein the first electrical contact formed on the first surface of the first printed circuit board is formed on a subset of the first surface of the first printed circuit board, a second surface of the first contacting structure being electrically coupled to a first electrical contact formed on a second surface of the first printed circuit board, wherein the first electrical contact formed on the second surface of the first printed circuit board is formed on a subset of the second surface of the first printed circuit board, wherein the first surface of the first contacting structure is at a different height and is generally parallel to the second surface of the first contacting structure, wherein the separation between the first surface of the first contacting structure and the second surface of the first contacting structure is approximately equal to the width of the first printed circuit board;

wherein a second end of the first conductive structure and a second end of the second conductive structure form a second contacting structure, a first surface of the second contacting structure being electrically coupled to a first electrical contact formed on a first surface of the second printed circuit board, and a second surface of the second contacting structure being electrically coupled to a second electrical contact formed on the first surface of the second printed circuit board, and further wherein the first surface of the first contacting structure is at a different height than the first surface of the second contacting structure.

* * * * *